United States Patent
Linder

(10) Patent No.: US 7,701,205 B2
(45) Date of Patent: Apr. 20, 2010

(54) METHOD AND DEVICE FOR MEASURING THE THICKNESS AND THE ELECTRICAL CONDUCTIVITY OF ELECTRICALLY CONDUCTING SHEETS

(75) Inventor: Sten Linder, Västerås (SE)

(73) Assignee: ABB AB, Västerås (SE)

( * ) Notice: Subject to any disclaimer, the term of this patent is extended or adjusted under 35 U.S.C. 154(b) by 440 days.

(21) Appl. No.: 10/585,111

(22) PCT Filed: Dec. 22, 2004

(86) PCT No.: PCT/SE2004/001981

§ 371 (c)(1),
(2), (4) Date: May 23, 2007

(87) PCT Pub. No.: WO2005/064268

PCT Pub. Date: Jul. 14, 2005

(65) Prior Publication Data

US 2007/0273371 A1     Nov. 29, 2007

(30) Foreign Application Priority Data

Dec. 31, 2003    (SE)    .................................... 0303612

(51) Int. Cl.
G01R 33/12    (2006.01)
G01N 27/82    (2006.01)

(52) U.S. Cl. ...................... 324/229; 324/240

(58) Field of Classification Search ................. 324/227, 324/229–243
See application file for complete search history.

(56) References Cited

U.S. PATENT DOCUMENTS

| | | | |
|---|---|---|---|
| 4,006,405 A * | 2/1977 | Greenwood et al. | 324/227 |
| 4,271,393 A | 6/1981 | Hansen et al. | |
| 4,639,669 A * | 1/1987 | Howard et al. | 324/239 |
| 4,740,747 A * | 4/1988 | Kawashima et al. | 324/239 |
| 4,818,936 A * | 4/1989 | Kemlo | 324/232 |
| 5,059,902 A | 10/1991 | Linder | |
| 5,283,520 A | 2/1994 | Martin et al. | |
| 5,512,821 A * | 4/1996 | Ando et al. | 324/225 |
| 6,593,737 B2 | 7/2003 | Crouzen et al. | |
| 6,661,224 B1 * | 12/2003 | Linder | 324/227 |

FOREIGN PATENT DOCUMENTS

WO    WO 01/01065 A1    1/2001

* cited by examiner

*Primary Examiner*—Jay M Patidar
(74) *Attorney, Agent, or Firm*—Venable LLP; Eric J. Franklin

(57) ABSTRACT

A method for non-contact measurement of a dimension and/or an electrical property in an electrically conducting object to be measured by using electromagnetic induction. An electromagnetic field is brought to penetrate through the object to be measured. A transmitter coil is place on one side of the object to be measured. A receiver coil is placed on the other side of the object to be measured. A magnetic field is generated in the transmitter coil. A sudden change is generated in the magnetic field generated in the transmitter coil from one level to another. The voltage induced in the receiver coil is detected. The period of time that elapses from the time of the change of the magnetic field in the transmitter coil up to the time when a voltage starts to be induced in the receiver coil is determined. The magnitude of the induced voltage is determined. The thickness and/or electrical conductivity of the object to be measured is calculated.

14 Claims, 4 Drawing Sheets

METHOD AND DEVICE FOR MEASURING THE THICKNESS AND THE ELECTRICAL CONDUCTIVITY OF ELECTRICALLY CONDUCTING SHEETS

CROSS-REFERENCE TO RELATED APPLICATIONS

This application claims priority to Swedish patent application 0303612-6 filed 31 Dec. 2003 and is the national phase under 35 U.S.C. §371 of PCT/5E2004/001981 filed 22 Dec. 2004.

TECHNICAL FIELD

The present invention relates primarily to non-contact measurement/determination of the sought properties or parameters of an object to be measured, such as, for example, geometrical dimensions or electrical properties. These may be the thickness or electrical conductivity of the object to be measured. The invention relates specifically to non-contact measurement that utilizes electromagnetic induction and measures on electrically conductive but substantially non-magnetic objects such as, for example, metal products.

One particular field of application is thickness measurement in the manufacture of metal sheets, metal strip, etc., and, for example, where it is necessary to continuously measure the thickness of the sheet to be able to increase the final quality of the sheet or strip.

The invention may also be used for measuring non-metallic, but electrically conductive, objects.

The invention is especially suited for non-contact and simultaneous measurement of thickness and electrical properties of a thin metallic and non-magnetic material such as, for example, metal foil.

BACKGROUND OF THE INVENTION

Measurement of dimensions and properties of metal products is of vital importance in the metal industry of today. To be able to control the end products to the desired quality in the manufacturing processes, it is of great importance for the continuous measurement of different quantities/parameters of the product to be correct and reliable. This particularly applies to the manufacture of sheet or strip where, for example, the thickness is of vital significance. The techniques that are used today such as, for example, light-based techniques, radiation-based techniques, and techniques with mechanical contact, are often sensitive to disturbances in the surroundings and to the composition of the measured material. Therefore, known methods are not suitable to use when the highest material quality is aimed at. A new fundamental measurement technique, which does not suffer from these shortcomings, is therefore necessary to demonstrate.

BACKGROUND ART

Inductive measurement technique has long been suggested as a possible measurement technique for measuring dimensions and properties of metals. The oldest methods in the field for which patent applications have been filed date back as early as 1920. This technique never became really industrially accepted and applied since the measurement of the thickness of an object was influenced far too much by the composition of the material.

Only after the technique disclosed in U.S. Pat. No. 5,059,902 and SE 517293 did the measurements become a success and the technique became industrially accepted and applied. With the new technique, industrially useful and successful measuring devices could be designed. These measuring devices solved the shortcomings from which the prior art measurement technique suffered.

One disadvantage of this new technique, however, has been that it has not been possible to use it for measuring very thin sheets such as, for example, metal foil. This is a considerable disadvantage, since an industrial measurement technique should be generally applicable and be able to measure sheets of different thicknesses and of different material properties.

Another known method for non-contact measurement of the thickness of a sheet is to irradiate the sheet with radioactive radiation or with x-ray radiation and then measure the radiation absorption of the sheet. This absorption is dependent on, among other things, the thickness of the sheet and constitutes a primary measured value of the thickness thereof. The measured value is, however, also influenced by the composition of the material, so the accuracy of measurement is not sufficiently good.

It is also previously known to measure the thickness of a strip or a sheet of an electrically conductive material with electrical induction methods. To this end, one or more transmitter coils are allowed to generate a time-varying magnetic field which is brought to penetrate into the electrically conductive material and to induce a current there. This current in turn generates a magnetic field that induces a voltage in one or more receiver coils. The induced voltage is used, after some signal processing, as a measure of the thickness.

The methods and devices which are most suited for the purpose, and therefore are most used in practice, are based on the use of the time variation that is received when current to the transmitter coils is suddenly cut off, for example in one stage. This method of achieving time variation has proved to provide methods and devices, which are useful in practice, to a considerably higher extent than the technique that is based on sinusoidal time variation, which was previously the commonly used technique.

The method that is described in U.S. Pat. No. 5,059,902 has proved to function well in many measurement contexts where measurement on electrically conductive materials has been aimed at. However, when measuring on sheet or strip, it has proved that it has not been possible to fulfil the highest demands for accuracy of measurement. Measurement at several points in time, and calculations based on these measured values, result in too large total errors.

In SE 517293, one such method is described, which is based on a suddenly switched-off current to the transmitter coil. This method has solved the measurement problem in that substantially a measurement for a certain given period of time immediately provides the thickness of the sheet or strip without being influenced by other varying parameters.

This method has meant an industrial breakthrough for the manufacture of metal sheet. With the introduction of this technique, it has been possible to measure thickness without being influenced by material parameters as when using roentgen/X-ray or isotope technique. There is no disturbing influence from the composition of the measurement region, that is, the composition of the air, the temperature of the surroundings or the material, oil and dirt, as when using X-ray, isotope or optical measurement. Still, the measurement is performed in a contactless or non-contacting manner.

However, one problem is that the technique cannot be used when measuring very thin sheet and strip. For this type of measurement, the magnetic field penetrates very rapidly into the centre of the sheet or strip, and the major part of this penetration occurs during an initial period of time. When the actual measurement is to be performed, that is, during a somewhat later period of time, the effect of the change has already ceased and no useful measured value is obtained.

Not being able to measure on thin sheet and strip means that the usefulness of the method is considerably reduced, since the same user of the method often wants to be able to use the measuring device on both thick and thin sheets. Other technique must therefore be procured and used in parallel, which results in additional costs, etc.

With present-day technique for contactless measurement of thin sheet, such as X-ray radiation and radioactive methods, sheet cannot be measured independently of the material; the measurement must be adapted/adjusted in view of the composition of the measured material. Further, the measurement is influenced by other things than the sheet in the region of measurement, such as by oil, water, air and other impurities. These problems of the existing technique constitute serious problems which limit the reliability of known techniques and hence their usefulness.

OBJECTS AND MOST IMPORTANT CHARACTERISTICS OF THE INVENTION

One important problem that needs to be solved is that prior art known methods of measurement and devices cannot be used for measuring thin or very thin sheets such as, for example, metal foil.

Prior art measuring devices and methods have not been able to fulfil the requirements for accuracy of measurement, not even when using inductive methods. Calculations based on such measurement values have resulted in too large errors.

Another problem of the prior art is that measurement of, for example, the thickness of a product is influenced by the material composition of the object to be measured.

A further problem is that different methods and measuring devices must be used in parallel today in order to carry out measurements of both thin and thick sheets.

One important problem to be solved in order to obtain a real breakthrough for the new technique is to achieve a method of measurement and a device therefor which exhibit a similar basic technique for measuring both thick and thin materials.

An additional problem is that the manufacture of strip and sheet is a power-demanding process, and in connection with accidents there is always a risk that meters, such as thickness meters, are damaged or destroyed. Therefore, it is important that the measuring devices are simple, inexpensive, and robust.

The object of the present invention is to provide a method and a device which solve the problems described above and which employ inductive measurement of sheet thickness and electrical conductivity of shin strip or thin sheet of electrically conductive material.

It is a further object of the present invention to provide a measurement of sheet thickness which can be performed using the devices that are already used for achieving measurement of sheet thickness on thicker strip or sheet. Nor should the position of the object to be measured during the measurement influence the accuracy of measurement in a negative way.

This is achieved according to the present invention by
placing a transmitter coil 3 on one side of the object to be measured,
placing a receiver coil 7 on the other, opposite, side of the object 5 to be measured,
generating a magnetic field in the transmitter coil 3,
the magnetic field generated in the transmitter coil 3 suddenly changing,
detecting the voltage S1 induced in the receiver coil 7,
determining the period of time Ta that elapses from the time t0 of the change of the magnetic field in the transmitter coil 3 up to the time t1 when a voltage starts being induced in the receiver coil 7,
determining the maximum magnitude S1max of the voltage induced in the receiver coil 7, and
based on measured values received, calculating the thickness and/or electrical conductivity of the object 5 to be measured.

A measuring device according to the invention comprises
arranging the transmitter coil 3 to generate a changeable magnetic field,
arranging the receiver coil 7 to generate a voltage S1 when being subjected to a change of magnetic field,
arranging a control circuit 1 to initiate a sudden change of the magnetic field in the transmitter coil 3,
arranging means 10, 11, 12, 13 to determine the time t1 for the penetration of the magnetic field through the object 5 to be measured and hence the time period Ta,
arranging means 13 to detect the maximum induced voltage S1max in the receiver coil 7, and arranging means 13 to calculate, based on these values, the thickness or electrical conductivity of the object 5 to be measured.

In other words, the lapse of time of the induced voltage is measured in the receiver coil after a sudden shut-off of the current feed to the transmitter coil, and these measured values are used in a calculation where the thickness of the sheet can be determined without the other properties of the sheet influencing. According to the invention, this is thus carried out essentially by calculating, from the lapse of time of the voltage, a time when the change of the magnetic field, emanating from the sudden shut-off of the current feed in the transmitter coil, starts penetrating through the sheet, and also by measuring, from the lapse of time of the voltage, the induced voltage after the change of field has penetrated through the sheet, and then using the ratio between this calculated time and the measured voltage as a primary measure of the thickness of the sheet.

Thus, the present invention solves the problem of making the magnetic measurement technique generally applicable. A user of the technique disclosed in SE 517 293 need not completely change the basic technique when sheet of a thin thickness is to be measured. The invention allows the measurement for thin sheet to be carried out with the same type of equipment and method.

The invention makes possible measurement with a few, extremely simple components, which are also not sensitive to mechanical damage and destruction. The equipment comprises simple coils and a few simple electric/electronic standard components.

The equipment may therefore advantageously be integrated with a thickness meter for thicker sheet according to known technique. It is even possible to use certain of the components, but in different ways, in common in both measuring devices.

BRIEF DESCRIPTION OF THE DRAWINGS

The invention will be described in greater detail below with reference to the accompanying figures.

DESCRIPTION OF THE PREFERRED EMBODIMENTS

Figure 1:
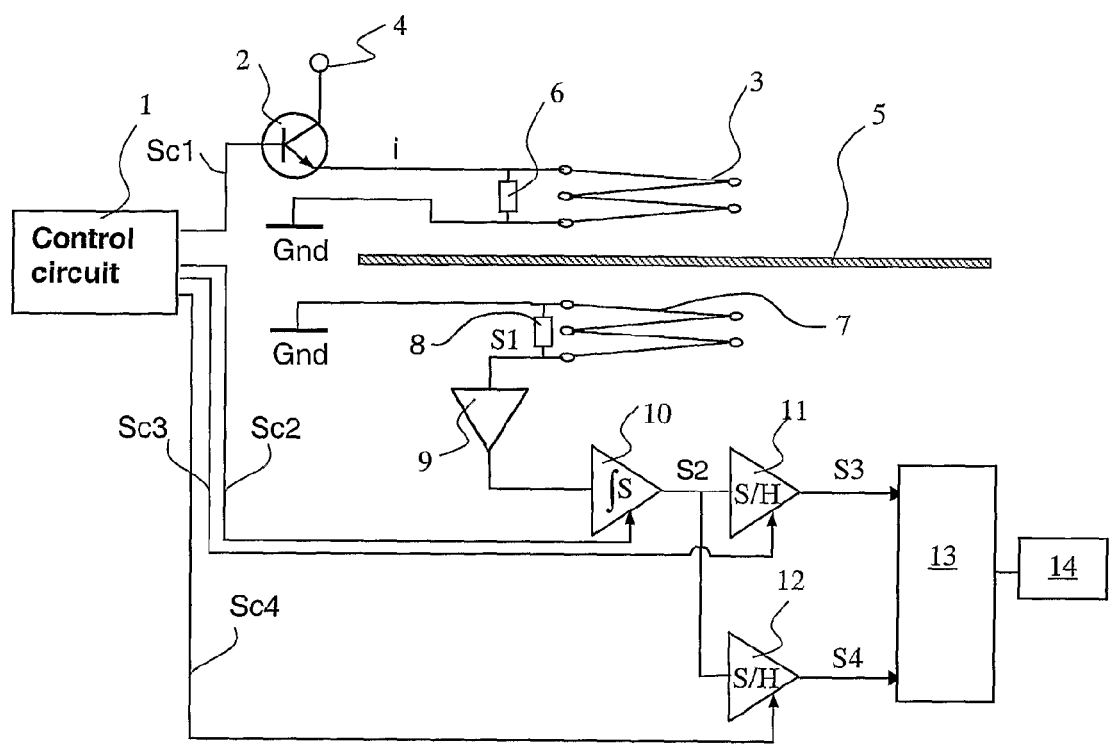
FIG. 1 shows an electronic circuit diagram of measuring equipment according to the invention.

FIG. 1 shows a circuit diagram according to the invention for measuring thickness and conductivity of an object, or an object 5 to be measured, and its electrical properties. The object 5 to be measured, here in the form of a sheet, is placed between a transmitter coil 3 and a receiver coil 7.

The transmitter coil 3 is fed, during a first period of time T1, with a substantially constant current i which comes from a current source 4 via a transistor 2. The transistor 2 is controlled by a signal Sc1 from a control circuit 1.

During a first period of time T1, a current-feed period, the transistor 2 carries current from the current source 4 to the transmitter coil 3 and further to ground Gnd. Directly after this current-feed period T1, the current to the transmitter coil 3 is interrupted by the transistor 2 shutting off. A resistor 6 across the transmitter coil 3 serves as a discharge resistor in connection with the interruption of the current.

This resistor 6 together with the inductance of the transmitter coil 3 determines the switch-off time of the transmitter coil 1.

The sheet 5, the thickness or electrical conductivity of which is to be measured, is placed in the vicinity of the transmitter coil 3 such that the sheet 5 is influenced by the magnetic field generated from the transmitter coil 3. On the other side of this sheet 5, a receiver coil 7 is arranged at such a distance from the transmitter coil 3 that it is influenced by the magnetic field of the transmitter coil 3.

The receiver coil 7 is connected by one connection to ground GnD and by its other connection to a voltage amplifier 9, and a discharge resistor 8 is also placed across the receiver coil 7. The voltage amplifier 9 transforms the induced voltage level S1 across the receiver coil 7 to a suitable level for the integrator circuit 10. In this integrator circuit 10, the voltage from the amplifier 9 is integrated from the time t1 when the feeding via the transistor 2 is interrupted and forwards in time. The control of the integrator circuit 10 is performed by the (time) control circuit 1 via a signal Sc2. The integrated signal S2 is passed to two parallel Sample and Hold (S/H) circuits 11, 12 where the value of the integrated signal S2 at two different times, determined by control signals Sc3 and Sc4 from the control circuit 1, is determined as two different voltage levels S3, S4.

The stable voltages S3 and S4 can now be used as initial values for calculating both the thickness of the sheet and the electrical conductivity thereof. This is done in a calculation circuit 13 which, for example, may be a subtraction amplifier, a processor, a computer, or the like. The calculation circuit 13 presents the final result in the form of an output signal to a computer or the like, or quite simply a value shown in a presentation unit 14.

FIGS. 2A-E illustrate examples in diagram form of the different signals that occur in measuring equipment according to FIG. 1. Five different diagrams A-E are shown, where in each diagram the horizontal axis shows the time and the vertical axis shows current and voltage levels. As mentioned, a control signals Sc1 brings the transistor 2 to open during a time period T1, allowing current to pass through the transmitter coil 3. The time period T1 is so long that all changes in the magnetic field, which is generated by the transmitter coil, due to changes in the current i, have ceased. In the diagrams in FIG. 2, the time period T1 is considered to have started even before the time shown in the diagrams.

At time t0, the transistor 2 is brought to shut off the current through the transmitter coil 3. The current through the transmitter coil 3 is clear from diagram A. That change in the magnetic field, generated by the transmitter coil 3, which becomes a consequence of the change of the current feed gradually penetrates through the sheet 5, and the change of the magnetic field around the receiver coil 7 induces a voltage S1 in the receiver coil 7. The voltage S1 thus induced is shown in diagram B in FIG. 2.

Only the change of time during time periods t0 to t4 is of primary interest since it is during this time period that the measurement of the parameters in question occurs. At time t0, no field change at the receiver coil 7 occurs at first, which is due to the fact that it takes a certain time for the field change from the transmitter coil 3 to penetrate through the object to be measured, i.e. the sheet 5. The absence of field change across the receiver coil 7 thus causes the induced voltage in the receiver coil 7 to initially be zero at time t0.

After a period of time Ta, from the time t0 when the current in the transmitter coil 3 was shut off, the change of the magnetic field has penetrated through the sheet 5 and hence also the magnetic field is changed in and around the receiver coil 7, which in turn gives rise to an induced voltage in the receiver coil 7. The change of field in the receiver coil 7 and hence the voltage across the receiver coil 7 S1 after a short while reach a maximum value S1max and then successively decrease.

The signal S1 is amplified in the amplifier circuit 9 and integrated in the integrator circuit 10 into a signal S2. The change of the signal S2 over time is shown in the diagram in FIG. 2C.

The integrator circuit 10 is reset during the period of time T1 when the transmitter coil 3 is fed with current and integrates the incoming signal voltage S1 only from time t0 onwards. At a time t4, when signal values S3, S4 have been measured at two different times t2, t3 and stored in the S/H circuits 11, 12, the integrator circuit 10 is reset by the control circuit 1.

The diagram in FIG. 2D shows the voltage signal S3 which has been detected at time t2. The S/H circuit 11 is controlled by the control signal Sc3 from the control circuit 1 in such a way that the value assigned to the voltage signal S2 at the time t2 is retained by the S/H circuit. The voltage signal emerging from this S/H circuit 11 when the process has been terminated, that is, after time t4, thus represents the signal relationship at time t2.

In a corresponding way, the diagram in FIG. 2E represents the voltage signal which is detected by the S/H circuit 12 and which represents the magnitude of the integrated signal S2 at time t3.

This completes the description of feeding of a transmitter coil 3 and measurement at a receiver coil 7. During practical use of this method and device, this sequence is repeated regularly. The output signals from the S/H circuits 11, 12 will then not be zero during the time period T1 and up to times t2 and t3. Instead, the signal values from the preceding sequence will remain during this time.

According to the invention, the time t2 is chosen in such a way that the change of the magnetic field has had ample time to penetrate, after the time period Ta, but before the signal S1 from the receiver coil has had time to fall considerably from its maximum value. The time period Ta may either be determined by measuring when the voltage signal in the receiver coil 7 has a value greater than zero for the first time, or by using measurements and calculations from a previous measuring instant.

The time period Ta may also be calculated from the following relationship:

$$Ta = \text{constant1} \times (\text{Sheet thickness})^2 \times \gamma$$

where $\gamma$ is the electrical conductivity of the sheet.

Constant1 is a generally applicable constant which may either be calculated using field theory or be measured in a known case. During practical use of this calculation formula, estimated values of sheet thickness and conductivity are used at first. Then, t2 is chosen such that the time period t1 to t2 is larger than this Ta value by a good margin.

Typically, t2 is selected such that the time period becomes twice as long as Ta, but the device functions well also when selecting t2 such that the time period becomes between 1.2× Ta and up to long after Ta, for example 10 times longer. A consequence of this is that Ta only needs to be roughly estimated to determine t2 and t3, which considerably facilitates the use of the invention.

As an example may be mentioned that if the sheet thickness is indicated in mm, the conductivity in 1/ohm/m and the time in microseconds, then Constant1 is approximately $2*\mu/\pi^2 = 2*10^{-7}$, where $\mu$ is the magnetic permeability in vacuum.

The time t2 is further selected so as to occur within the time period Tb, a time period after which S1 still lies close to its maximum value S1max. By S1 lying close to its maximum value is meant here that the signal value has not dropped more than 10%. The best results when using the device according to the invention are obtained if Tb is a time period of such a duration that the signal value S1 has only fallen insignificantly from its maximum value, for example 2% at the end of the period.

Also in those cases where the signal value is measured at a time when it has fallen below S1max, a correct value of S1max may be calculated with sufficient accuracy. This can be done by solving the underlying fundamental equations for this case (Maxwell's equations). Such a solution is complicated to achieve, but it has proved that a simple adjustment of the measured values at t2 and t3, respectively, can be obtained as follows:

$$S3 \text{ just} = \frac{1 - \sqrt{1 - 2*\text{konstant2}*S3}}{\text{konstant2}}$$

$$S4 \text{ just} = \frac{1 - \sqrt{1 - 2*\text{konstant2}*S4}}{\text{konstant2}}$$

$$S1\max = \frac{S4 \text{ just} - S3 \text{ just}}{t3 - t2}$$

Konstant2 is here a constant, independent of the object to be measured, which may be calculated or measured in a case with a known object 5 to be measured. The calculation of S3 just and S4 just may be further refined, with the aid of calculations with fundamental underlying equations, thus making it possible to measure also when the signal value has dropped more than 10%, but inside these 10% the above-mentioned adjustment is sufficient.

The time t3 is selected such that it is behind the time t2 but still before the signal S1 has dropped too much from S1max. It has proved from experience that it is suitable to place the time t3 approximately twice as long from t1 as t2.

In the embodiment of the invention described above, the current feed to the transmitter coil 3 has been interrupted. The invention is not, however, limited to such a change of the current feed, but the invention may be caused to function also with other sudden changes from one constant current value to another. A total shut-off of the current, from a constant current value down to zero, is normally preferable, not least because it is technically easier to rapidly shut off a current completely with a transistor than to rapidly switch on a current or to rapidly change a current from one value to another.

The duration of the period of penetration (Ta) is calculated, according to the invention, by regarding the voltage S2 as a linear function of the time in the region around t2 and t3, and then with the aid of the signal values S3 and S4 at t2 and t3 calculating the time value of this function when the signal is zero (0). Likewise, S1max is calculated as the inclination of this function. Alternatively, S3 just and S4 just are used for this calculation in those cases where the signal S has fallen considerably in relation to S1max. The thickness of the object may then be calculated as the product of S1max and Ta.

The two signal values S3, S4, which are obtained from the S/H circuits 10,11, or, alternatively, the calculated values S3 just, S4 just, are used for calculating, in an unambiguous way, values of the thickness and electrical conductivity of the object to the measured, i.e. the sheet 5. This is carried out in the calculating circuit 13 by calculating the thickness and the conductivity $\gamma$ from the algorithm:

$$\text{Sheet thickness} = \text{Constant3} \times (S3 \times t3 - S4 \times t2)/(t3 - t4)$$

$$\gamma = \text{Constant4}/((S4 - S3) \times (S3 \times t3 - S4 \times t2))$$

Constant1 and Constant2 are determined by measurement on sheet of a known thickness and of a known electrical conductivity. This method of calculation has proved to function well when times t2 and t2 may be selected such that they will both lie near the maximum value $S1_{max}$ of the signal S1. However, it may be difficult, in a practical case, to select t2 and t3 in this way, due to the fact that it is not known in advance where in time this maximum value lies.

According to an alternative embodiment in accordance with the invention, the starting-point may also be an appearance of the integrated signal S2, which is known in advance by measurement of a plurality of sheets of a known thickness and a known conductivity, or which is known by calculation, and by comparing this known appearance with the signal for S3 at t2 and S4 at t3, thickness and conductivity may be calculated on the unknown sheet during measurement.

Figure 2:
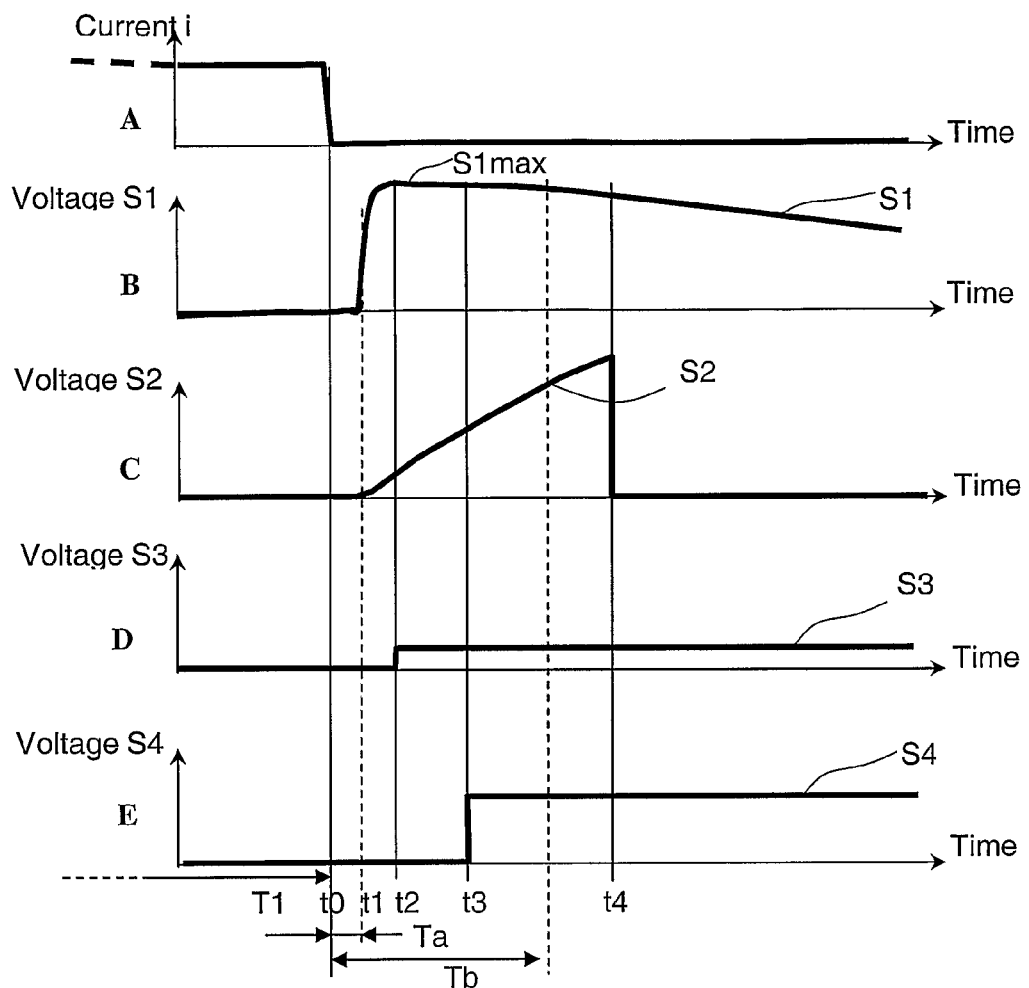
FIGS. 2A-E show five different signal diagrams showing the signal values at different times.

According to a similarly alternative embodiment in accordance with the invention, the time of penetration Ta and the maximum induced voltage S1max may be calculated directly from the induced signal S1 according to FIG. 2. This may be done either by detecting when a certain signal level is achieved the first time after t1 as a measure of Ta and by sensing the maximum value of the signal S1 as a measure of S1max. Then the thickness of the sheet 5 may be calculated as being proportional to the product of these two values.

Further, the reciprocal value of the electrical conductivity may be obtained as the product of the square of the value of S1max and the value of Ta. Values of Ta and S1max may also be obtained in a similar manner by first converting the signal S1 into digital form and then carrying out the determination according to the above in a calculating circuit.

A further alternative method of determining thickness and conductivity from the signal S1, or alternatively S3 and S4, is to calculate, based on assumed values of thickness and conductivity, signals with the fundamental electromagnetic equations and to compare these calculated signals with measured signals. When calculated and measured signals correspond, the assumptions concerning thickness and conductivity are accurate. An essential advantage of arranging the measurement in accordance with the invention has proved to be that the signals measured, S1 or alternatively S3 and S4, become completely independent of the position of the object in relation to coils. Contrary to other inductive measuring devices, this means that no compensation for the position of the object is needed.

Figure 3:
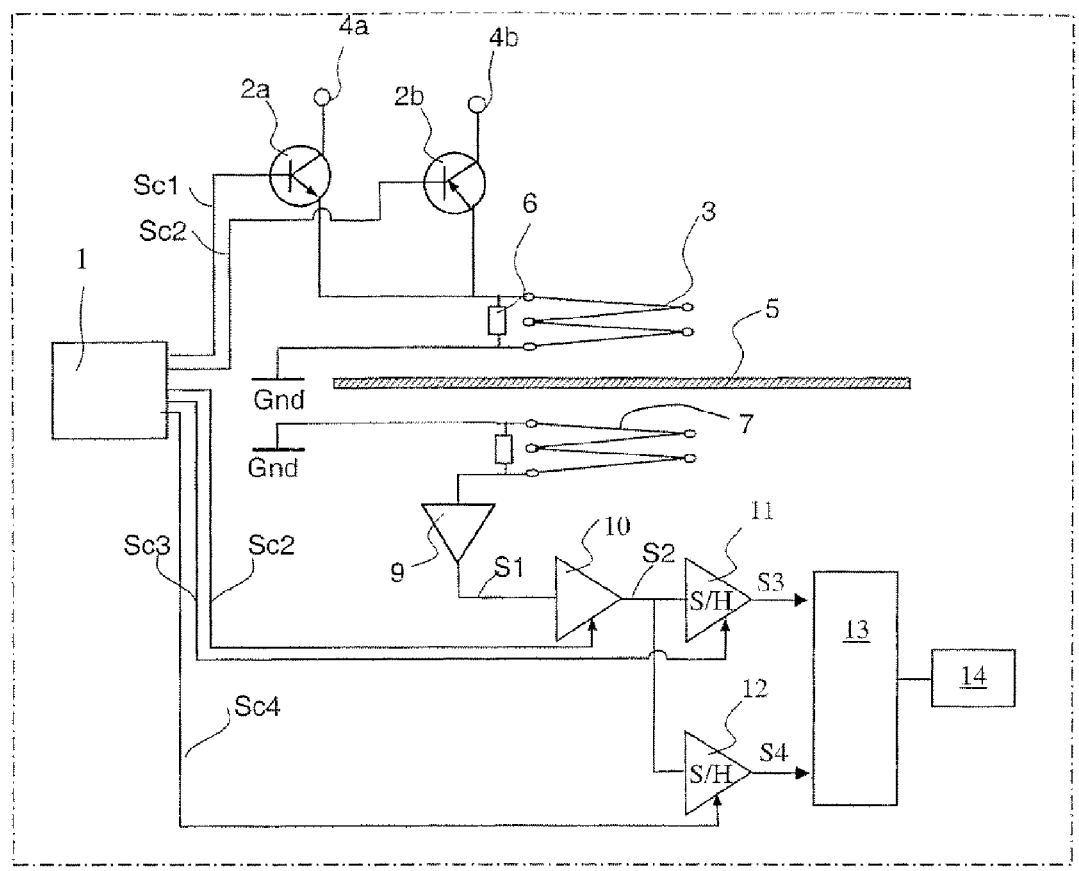
FIG. 3 shows an alternative solution to measuring equipment according to the invention, where the direction of the current through the transmitter coil is alternately changed.
Figure 4:
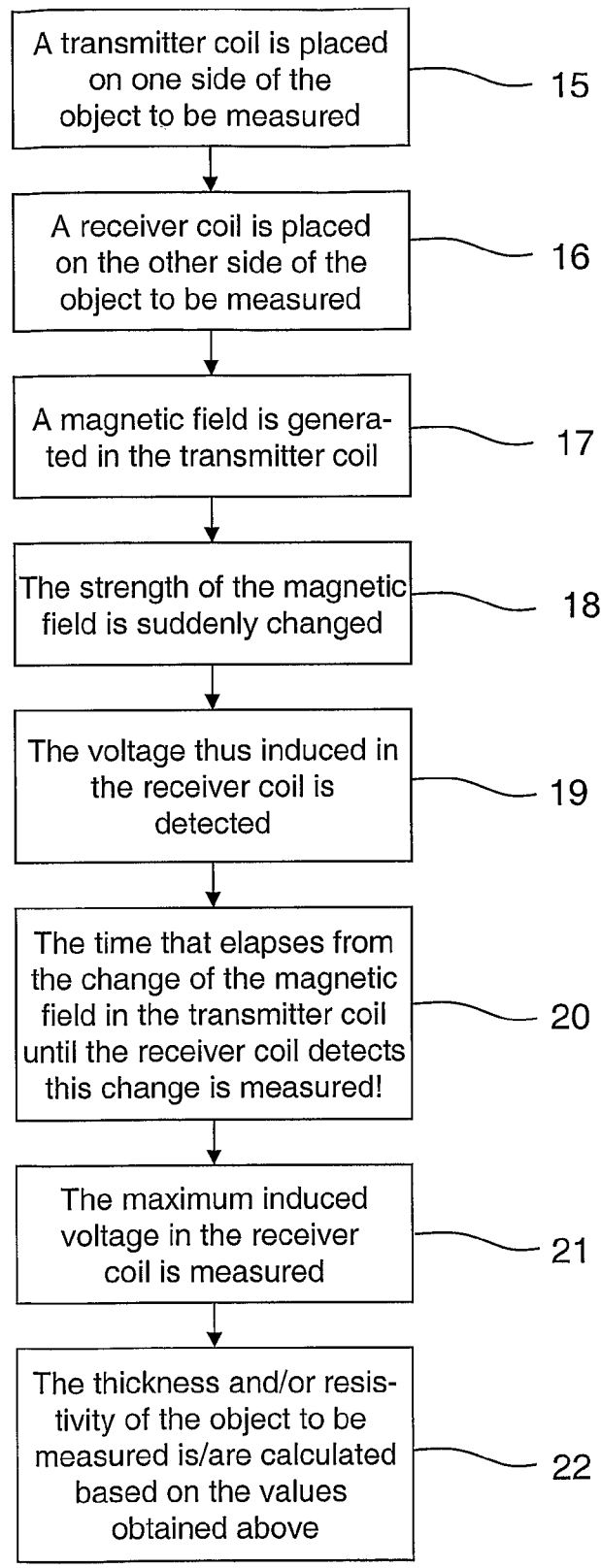
FIG. 4 shows a flow diagram of a method according to the invention.

An alternative method of determining the time of penetration Ta and the magnetic flux through the sheet 5 is shown in FIG. 3. Two transistors 2a,b are arranged for controlling the supply current to the transmitter coil 3. The first transistor 2a is arranged to carry current from a constant current source 4a to the transmitter coil 3 and the second transistor 2b is arranged to carry current from the transmitter coil 3 to the output 4b connected to a constant current sink or voltage with a negative potential. A discharge resistor 6 is connected by way of the transmitter coil 3. The two transistors 2a and 2b are controlled from the control circuit 1 in such a way that they alternately carry current.

During a first period of time T1, up to time t1 (see FIG. 2), only one transistor 2a carries current so that the current flows through the transmitter coil 3 and then to ground Gnd. During the period from t1 to a point some time after t4, both transistors 2a,b are closed and the signals, generated by the voltage induced in the receiver coil 7, are measured. Thereafter, the process is repeated with the difference that the second transistor 2b carries current in the opposite direction, that is, from ground Gnd through the transmitter coil 3 via the transistor 2b to the output 4b which has a negative potential.

The changes of the magnetic field will now alternately have different directions and the voltage S1 induced in the transmitter coil 3 will alternately be of different polarities. The output signal from the S/H circuits 11,12 becomes an ac voltage with a square-wave appearance. When this signal is treated in the calculating circuit 13, the difference between the positive signal value and the negative signal value is used as measured values of S3, S4. In this way, values of the two quantities are obtained which are not influenced by, for example, zero errors in the electronic circuits 7-12, and the calculation of the thickness and the electrical conductivity of the sheet 5 will be even more accurate than when using the circuit solution according to FIG. 1. The embodiment according to FIG. 3 is preferable when very high demands for accuracy of measurement are made.

The method according to the invention may, at least partly, be carried out with the aid of program codes which are run in a processor or on a computer, and these program codes may be stored on a computer-readable medium such as a hard disk, a diskette, a CD-ROM, other movable memory, etc. The program codes may be at least partly transmitted via a network. The network may be the internet.

One important aspect of this invention, which is primarily intended to be used for measuring on thin sheet, is that the coils described in connection with FIGS. 1 and 3 may also be used for measuring on thicker sheet by means of any of the inductive techniques which have been described as new. So, coils that are used for measuring thicker sheet according to SE 517 293 may be given a different use, for example according to FIG. 3, by changing, depending on sheet thickness, the feeding to transmitter coils and connection of receiver coils.

Although the invention as defined above has been described by means of a few embodiments, the invention is not, of course, limited to these embodiments; other embodiments and variants are feasible within the scope of protection of the claims. Thus, for example, it is conceivable for the calculation of the thickness and/or electrical conductivity of the object of measurement to be made also using mathematical formulae which are, completely or partly, different from those described in the application.

The invention claimed is:

1. A method for non-contact measurement of a dimension and/or an electrical property of an electrically conductive object to be measured, the method comprising:
    placing a transmitter coil on one side of the object to be measured,
    placing a receiver coil on another, opposite, side of the object to be measured,
    generating a magnetic field in the transmitter coil,
    suddenly changing the magnetic field generated in the transmitter coil,
    detecting a voltage induced in the receiver coil,
    determining a period of time that elapses from a time of the change of the magnetic field in the transmitter coil up to a time when a voltage starts being induced in the receiver coil,
    determining a maximum magnitude of the voltage induced in the receiver coil, and based on measured values received, calculating the dimension and/or electrical conductivity of the object to be measured,
    wherein the voltage induced in the receiver coil is integrated, and wherein the dimension and/or electrical conductivity of the object to be measured is calculated based on a value of the integrated signal at least two different points in time.

2. The method according to claim 1, wherein the dimension and/or electrical conductivity of the object to be measured is calculated based on the period of time and the maximum voltage induced in the receiver coil.

3. The method according to claim 1, wherein the dimension and/or electrical conductivity of the object to be measured is calculated based on a product of the period of time and the maximum voltage induced in the receiver coil.

4. The method according to claim 1, wherein the dimension and/or electrical conductivity of the object to be measured is calculated based on a reciprocal value of a product of a square of the maximum voltage induced in the receiver coil and the period of time.

5. The method according to claim 1, wherein the voltage induced in the receiver coil is integrated and wherein the dimension and/or electrical conductivity of the object to be measured is calculated based on a value of the integrated signal.

6. The method according to claim 1, wherein the two different points in time are determined in advance.

7. The method according to claim 1, wherein the two different points in time are located within the time interval, that is, between a time for the sudden change of the magnetic field in the transmitter coil and a time when the voltage induced in the receiver coil has safely dropped below the maximum value.

8. The method according to claim 1, wherein the two different points in time are located within the time interval but after the period of time.

9. A measuring device for non-contact determination of one or more sought properties of an object to be measured, the measuring device comprising:
    at least one transmitter coil and at least one receiver coil spaced apart from each other, wherein the transmitter coil is arranged to generate a changeable magnetic field, and the receiver coil is arranged to generate a voltage when being subjected to a change of magnetic field, a magnetic field generator configured to generate a changeable magnetic field in the transmitter coil and a detector configured to detect a voltage induced in the receiver coil, a control circuit arranged to initiate a sudden change of the magnetic field in the transmitter coil, a sensor arranged to determine the time for the penetration of the magnetic field through the object to be measured and hence the time period, a detector arranged to detect the maximum induced voltage in the receiver coil, a calculator arranged to calculate, based on these values, the thickness or electrical conductivity of the object to be measured, and circuits arranged to measure the voltage induced in the receiver coil at two different times after the time for interruption in the transmitter coil.

10. The measuring device according to claim 9, further comprising:

an integrator arranged to integrate the voltage signal induced in the receiver coil.

11. The measuring device according to claim 9, further comprising:

circuits arranged to detect the period of time that elapses from the time for the change of the magnetic field in the transmitter coil up to the time when a voltage starts being induced in the receiver coil.

12. A computer program product, comprising:

a computer readable medium; and computer code recorded on the computer readable medium and executable by a processor for carrying out the steps of generating a magnetic field in a transmitter coil arranged on a first side of an object to be measured, suddenly changing the magnetic field generated in the transmitter coil, detecting a voltage induced in a receiver coil arranged on a second side of the object to be measured, determining a period of time that elapses from a time of the change of the magnetic field in the transmitter coil up to a time when a voltage starts being induced in the receiver coil, determining a maximum magnitude of the voltage induced in the receiver coil, and based on measured values received, calculating the dimension and/or electrical conductivity of the object to be measured, wherein the voltage induced in the receiver coil is integrated, and wherein the dimension and/or electrical conductivity of the object to be measured is calculated based on a value of the integrated signal at least two different points in time.

13. The computer program product according to claim 12, wherein the computer code is further for carrying out the step of at least partly transmitting the computer code via a network.

14. The computer program product according to claim 13, wherein the network is the internet and the computer code is at least partially transmitted via the internet.

\* \* \* \* \*